US 6,541,699 B1

(12) United States Patent
Lindemulder et al.

(10) Patent No.: US 6,541,699 B1
(45) Date of Patent: Apr. 1, 2003

(54) CONNECTION FOR ELECTROMAGNETIC INTERFERENCE ENCLOSURES

(75) Inventors: Charles R. Lindemulder, Wyoming, MI (US); Michael L. Nienaber, Berthoud, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/523,478

(22) Filed: Mar. 10, 2000

(51) Int. Cl.[7] ................................................ H01J 15/00
(52) U.S. Cl. ........................ 174/50; 174/58; 220/4.02
(58) Field of Search ........................ 174/48, 50, 58, 174/53, 35 R, 35 RC; 220/3.2, 3.3, 3.9, 4.02; 439/135; 361/826, 800

(56) References Cited

U.S. PATENT DOCUMENTS

| | | | | |
|---|---|---|---|---|
| 4,134,636 A | * | 1/1979 | Kleinatland et al. | 174/58 X |
| 5,317,108 A | * | 5/1994 | Prairie, Jr. | 174/67 |
| 5,660,297 A | * | 8/1997 | Liu | 220/4.02 |
| 6,005,188 A | * | 12/1999 | Teichler et al. | 174/50 |
| 6,145,683 A | * | 11/2000 | Taniguchi | 220/4.02 |
| 6,147,306 A | * | 11/2000 | Wilkins | 174/58 |
| 6,166,329 A | * | 12/2000 | Oliver et al. | 174/58 |
| 6,172,298 B1 | * | 1/2001 | Norvelle | 174/48 |

* cited by examiner

Primary Examiner—Dean A. Reichard
Assistant Examiner—Dhiru R Patel
(74) Attorney, Agent, or Firm—Patton Boggs LLP

(57) ABSTRACT

An improved electromagnetic interference connection between a pair of electromagnetic interference enclosures that provides electromagnetic compatibility for electrical devices housed in the pair of electromagnetic interference enclosures. The connection includes of a detachable lap joint integrally formed along a first pair of edges in a first electromagnetic interference enclosure and a second pair of edges in a second electromagnetic interference enclosure. The lap joint forms a detachable overlapping metallic joint between the pair of electromagnetic interference enclosures that prevents electromagnetic emissions from the joint without the use of seals or fasteners.

13 Claims, 2 Drawing Sheets

CONNECTION FOR ELECTROMAGNETIC INTERFERENCE ENCLOSURES

FIELD OF THE INVENTION

The invention relates to electromagnetic interference enclosures, and specifically to an improved electromagnetic interference connection between a pair of electromagnetic interference enclosures.

PROBLEM

Electromagnetic interference enclosures are housings that isolate sensitive equipment from ambient electromagnetic radiation interference. Electromagnetic interference enclosures also confine electromagnetic radiation emitted from internally housed electronic equipment within the enclosure. These enclosures provide electromagnetic compatibility in their environment of use. Electromagnetic compatibility is the ability of equipment to operate satisfactorily in its electromagnetic environment without introducing intolerable electromagnetic disturbances to other electrical devices in the environment.

One commonly known electromagnetic interference enclosure is the rack mounted modular housing. Rack mounted modular housings are generally rectangular in shape and are configured to mount on a rack in a stacked configuration with other similar housings. These enclosures are constructed from metallic materials that are known to contain electromagnetic radiation from the internally housed equipment.

Often, the electronic equipment enclosed in the individual modular rack mounted housings must be joined to other equipment enclosed in adjacent housings. Electrical cables, that pass through apertures or keyways cut into the housings, make the connection. The keyways are cut in the top and/or bottom portion of the respective housing allowing the cables to pass between the housings and connect the devices. To prevent electromagnetic radiation leakage from the keyways and out through the seam between the housings, a metallic joint must be formed between the two housings. One method of forming this joint is to screw or bolt together perpendicular flanges integrally formed or connected to each housing. In some instances a conductive gasket is also used in the joint to prevent leakage through the seam. In other instances copper connections are also used to maintain the metal to metal contact between the housings.

Unfortunately, assembling the housings is labor intensive, as it requires multiple individuals and the attachment of multiple fasteners. Depending on the size of the housing, one or more individuals typically must position the housing on the rack while a third individual attaches the fasteners. The problem is further compounded during field assembly where working conditions can be cramped and extra parts are not readily available. Therefore, it is desirable in the art to have a detachable connection that is easily assembled and provides the requisite electromagnetic compatibility for the electronic devices.

SOLUTION

The present invention advances the art by providing an improved electromagnetic connection between a pair of electromagnetic interference enclosures. A first advantage of the present invention is that the improved connection provides electromagnetic compatibility for electrical devices housed in the pair of electromagnetic interference enclosures. A second advantage of the present invention is that the improved connection does not require separate fasteners or seals during assembly. A third advantage of the present invention is that the improved connection allows multiple electromagnetic interference enclosures to be easily assembled. A fourth advantage of the present invention is that strict alignment of the electromagnetic interference enclosures is maintained during assembly.

The improved connection is comprised of a pair of female flanges integrally formed along a pair of edges on a first electromagnetic interference enclosure and a pair of male flanges integrally formed along a pair of edges on a second electromagnetic interference enclosure. The pair of female flanges mate with the pair of male flanges during assembly to form lap joints between the two enclosures. The lap joints form a continuous overlapping metallic seam between the pair of electromagnetic interference enclosures that prevents electromagnetic emissions from escaping or entering the enclosures.

DETAILED DESCRIPTION

Figure 1:
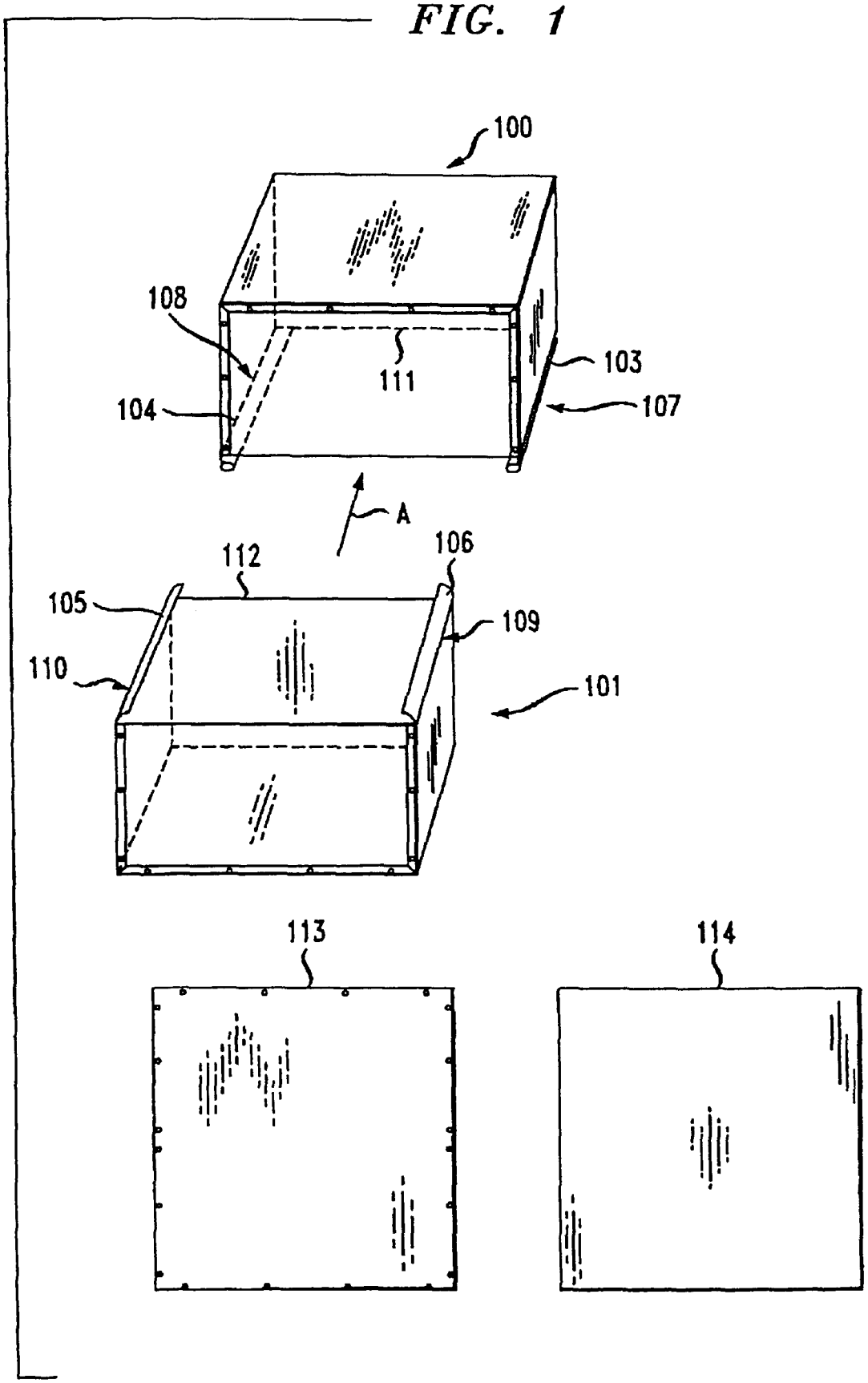
FIG. 1 illustrates an assembly view of a pair of electromagnetic enclosures configured with the improved connection according to the present invention.

FIG. 1 illustrates an assembly view of a pair of electromagnetic interference enclosures 100 and 101 configured with a connection according to the present invention. Enclosure 100 is a substantially rectangular metallic enclosure having an integrally formed female flange 103 along a first bottom edge 107 and a second integrally formed female flange 104 along a second bottom edge 108. Enclosure 101 is a similar substantially rectangular metallic enclosure having an integrally formed male flange 106 along a first top edge 109 and a second integrally formed male flange 105 along a second top edge 110. Female flange 103 is configured to accept male flange 106 and female flange 104 is configured to accept male flange 105 to connect enclosure 100 to enclosure 101 along plane A. In some examples of the invention, flanges 103, 104, 105, and 106 could be keyed so that flange 103 will only mate with flange 106 and flange 104 will only mate with flange 105. Advantageously, this prevents enclosures from being connected in the wrong direction in environments where the direction of connection is important. Front cover 113 and back cover 114 are connected to enclosures 100 and 101 in a conventional manner using fasteners around the edges of front cover 113 and back cover 114 to seal enclosures 100 and 101.

Flanges 103, 104, 105, and 106 are constructed from a metallic material so that a continuous metallic lap joint is formed between enclosure 100 and enclosure 101. As is readily apparent from FIG. 1 additional enclosures could be fitted with appropriate male and female flanges e.g. 103 and 106 and could be connected to enclosures 100 and 101 in a similar fashion. Those skilled in the art will appreciate that enclosure 101 may or may not include a top and enclosure 100 may or may not include a bottom. Advantageously, where enclosure 101 does not include a top and enclosure 100 does not include a bottom, the metallic joints formed by flanges 103 and 106 and flanges 104 and 105 in conjunction with the front cover 113 and back cover 114 provide electromagnetic compatibility for internally housed electrical devices. Also advantageously, the lap joints between enclosure 101 and enclosure 100 provide quick assembly and alignment without the use of additional fasteners.

In another example of the invention, a female flange e.g. 103 could also be included along the back edge 111 of enclosure 100. In this case, a mating male flange e.g. 105 would be included along the back edge 112 of enclosure 101 so that enclosures 100 and 101 are bounded on three sides by a first, second, and third lap joint. Advantageously, in this embodiment the third connection along edges 111 and 112 further secures enclosures 100 and 101 ensuring better alignment and structural integrity. Those skilled in the art will appreciate that in this example, enclosures 100 and 101 would include their own individual back covers and thus only front cover 113 is necessary to seal enclosures 100 and 101.

Figure 2:
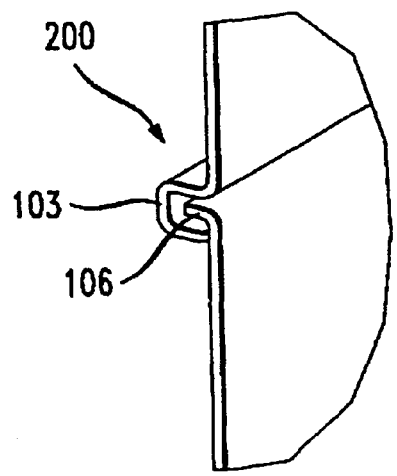
FIG. 2 illustrates a perspective view of the improved connection according to the present invention.

FIG. 2 illustrates an exploded view of the joint formed by female flange 103 and male flange 106. On FIG. 2 female flange 103 is configured to slidably accept male flange 106 securely therein to form the lap joint 200. A similar connection is formed by female flange 104 and male flange 105. Advantageously, female flanges 103 and 104 provide a guide that maintains proper alignment of enclosure 100 and enclosure 101 during assembly. Also, advantageously, the continuous metal barrier formed by the lap joints, e.g. 200, prevent electromagnetic radiation leakage through the joint 200. Still advantageously, the lap joint, e.g. 200, is detachable so that the enclosures 100 and 101 are easily made mobile.

Figure 3:
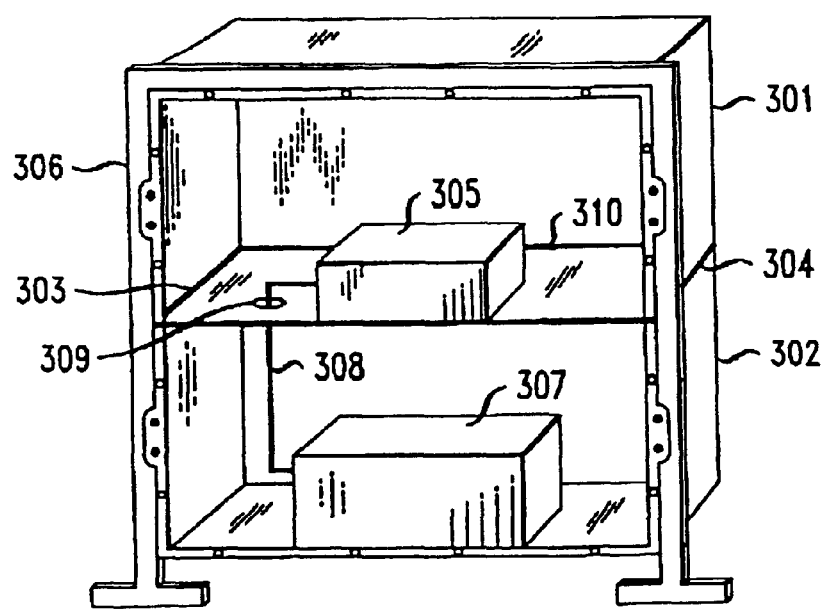
FIG. 3 illustrates a modular rack mounted carrier configured with the improved connection according to the present invention.

FIG. 3 illustrates a modular rack mounted carrier configured with an improved electromagnetic connection according to the present invention. On FIG. 3 a modular housing 301 and a modular housing 302 are connected by the lap joint of FIG. 2 to form lap joints 303, 304, and 310. Electronic devices 305 and 307 are enclosed in modular housings 301 and 302 respectively. Electrical cable 308 passes through keyway 309 cut in the bottom of modular housing 301 and the top of modular housing 302. Modular housings 301 and 302 are connected to frame 306 by conventional methods in a stacked configuration. A solid panel not shown on FIG. 3 for clarity is used to seal the front face of modular housings 301 and 302. Advantageously, electromagnetic compatibility is provided in the rack mounted carrier without the use of fasteners and/or seals in joints 303, 304, and 310. Also advantageously, the housings 301 and 302 can be easily assembled and aligned in the field by a single individual without the use of additional fasteners and/or seals.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. An electromagnetic interference connection between a pair of electromagnetic interference enclosures, the electromagnetic interference connection comprising:

female flange means integrally formed along a first edge of a first electromagnetic interference enclosure and along a second edge of said first electromagnetic interference enclosure; and a mating male flange means integrally formed on a first edge of a second electromagnetic interference enclosure and on a second edge of said second electromagnetic interference enclosure for forming a first continuous overlapping electromagnetic interference joint and a second continuous overlapping electromagnetic interference joint between said first and second electromagnetic interference enclosures.

2. The connection of claim 1 further comprising:

means integrally formed along a third edge of said first electromagnetic interference enclosure for forming a third continuous overlapping electromagnetic interference joint between said first electromagnetic interference enclosure and said second electromagnetic interference enclosure; and a mating means on a third edge of said second electromagnetic interference enclosure for forming said third continuous overlapping electromagnetic interference joint between said first and second electromagnetic interference enclosure.

3. The connection of claim 2 wherein said first, second, and third overlapping electromagnetic interference joints are configured to provide electromagnetic compatibility for electrical devices housed in said first and second electromagnetic interference enclosures.

4. The connection of claim 3 wherein said first, second, and third overlapping electromagnetic interference joint are lap joints.

5. The connection of claim 3 wherein said first, second, and third overlapping electromagnetic interference joints are detachable.

6. A modular rack mounted carrier comprising:

a first modular housing;

a second modular housing;

a first female flange integrally formed along a first edge of said first modular housing;

a second female flange integrally formed along a second edge of said first modular housing;

a first male flange integrally formed along a first edge of said second modular housing that mates with said first female flange on said first modular housing to form a first continuous overlapping electromagnetic interference joint;

a second male flange integrally formed along a second edge of said second modular housing that mates with said second female flange on said first modular housing to form a second continuous overlapping electromagnetic interference joint; and a rack connected to at least one of said first modular housing and said second modular housing for supporting said first and second modular housings.

7. The carrier of claim 6 wherein the said first overlapping electromagnetic interference joint and said second overlapping electromagnetic interference joint are configured to provide electromagnetic compatibility for electrical devices housed in said first modular housing and said second modular housing.

8. The carrier of claim 7 wherein said first overlapping electromagnetic interference joint and said second overlapping electromagnetic interference joint are lap joints.

9. The carrier of claim 7 wherein said first overlapping electromagnetic interference joint and said second overlapping electromagnetic interference joint are detachable.

10. An electromagnetic interference connection between a pair of electromagnetic interference enclosures, the electromagnetic interference connection comprising:

means integrally formed along a first edge of a first electromagnetic interference enclosure and along a second edge of said first electromagnetic interference enclosure for forming a first continuous overlapping electromagnetic interference joint and a second continuous overlapping electromagnetic interference joint between said first electromagnetic interference enclosure and a second electromagnetic interference enclosure;

a mating means on a first edge of said second electromagnetic interference enclosure and on a second edge of said second electromagnetic interference enclosure for forming said first continuous overlapping electromagnetic interference joint and said second continuous overlapping electromagnetic interference joint between said first and second electromagnetic interference enclosures;

means integrally formed along a third edge of said first electromagnetic interference enclosure for forming a third continuous overlapping electromagnetic interference joint between said first electromagnetic interference enclosure and said second electromagnetic interference enclosure; and a mating means on a third edge of said second electromagnetic interference enclosure for forming said third continuous overlapping electromagnetic interference joint between said first and second electromagnetic interference enclosure.

11. The connection of claim 10 wherein said first, second, and third overlapping electromagnetic interference joints are configured to provide electromagnetic compatibility for electrical devices housed in said first and second electromagnetic interference enclosures.

12. The connection of claim 11 wherein said first, second, and third overlapping electromagnetic interference joint are lap joints.

13. The connection of claim 11 wherein said first, second, and third overlapping electromagnetic interference joints are detachable.

* * * * *